US010365855B2

(12) United States Patent
Park

(10) Patent No.: US 10,365,855 B2
(45) Date of Patent: Jul. 30, 2019

(54) CONTROLLER READING DATA STORED IN A MEMORY DEVICE USING BUFFERS, OPERATING METHOD THEREOF AND MEMORY SYSTEM INCLUDING CONTROLLER

(71) Applicant: SK hynix Inc., Gyeonggi-do (KR)

(72) Inventor: Byeong-Gyu Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/813,543

(22) Filed: Nov. 15, 2017

(65) Prior Publication Data

US 2018/0293022 A1 Oct. 11, 2018

(30) Foreign Application Priority Data

Apr. 10, 2017 (KR) ........................ 10-2017-0046137

(51) Int. Cl.
*G11C 7/10* (2006.01)
*G06F 3/06* (2006.01)
*G06F 12/0871* (2016.01)
*G06F 13/16* (2006.01)

(52) U.S. Cl.
CPC .......... *G06F 3/0656* (2013.01); *G06F 3/0659* (2013.01); *G06F 12/0871* (2013.01); *G06F 13/161* (2013.01); *G06F 13/1673* (2013.01); *G11C 7/10* (2013.01); *G06F 2003/0691* (2013.01)

(58) Field of Classification Search
CPC ... G11C 7/1039; G11C 7/1051; G11C 7/1078; G06F 3/0656; G06F 13/1673; G06F 13/161; G06F 12/0871; G06F 3/0659; G06F 2003/0691
See application file for complete search history.

(56) References Cited

U.S. PATENT DOCUMENTS

| 9,715,342 B2* | 7/2017 | Amidi ................. G06F 12/0246 |
| 2006/0181924 A1* | 8/2006 | Cha ........................ G11C 16/10 365/185.12 |
| 2008/0215829 A1* | 9/2008 | Lin .......................... G06F 3/061 711/155 |
| 2010/0103723 A1* | 4/2010 | Kawai ..................... G11C 11/56 365/163 |
| 2010/0153618 A1* | 6/2010 | Mathieson ............ G06F 13/385 711/102 |
| 2011/0055486 A1* | 3/2011 | Heo .................... G06F 12/0868 711/128 |

(Continued)

FOREIGN PATENT DOCUMENTS

| KR | 1020100022282 | 3/2010 |
| KR | 1020140042518 | 4/2014 |

*Primary Examiner* — Khamdan N. Alrobaie
(74) *Attorney, Agent, or Firm* — IP & T Group LLP

(57) ABSTRACT

A controller includes: a first buffer suitable for buffering data read from a memory device; a second buffer suitable for buffering data to be written into the memory device; a processor suitable for, in response to a read command, controlling the memory device to read data therefrom and the first buffer to buffer the read data; and a buffer management unit suitable for, in response to the read command, providing the buffered data of the first buffer when the second buffer does not currently buffer data to be read.

16 Claims, 9 Drawing Sheets

(56) References Cited

U.S. PATENT DOCUMENTS

2012/0072660 A1\* 3/2012 Lin .................. G06F 3/061
　　　　　　　　　　　　　　　　　　　711/113
2013/0242677 A1\* 9/2013 Iyer ................. G11C 11/412
　　　　　　　　　　　　　　　　　　　365/189.15

\* cited by examiner

CONTROLLER READING DATA STORED IN A MEMORY DEVICE USING BUFFERS, OPERATING METHOD THEREOF AND MEMORY SYSTEM INCLUDING CONTROLLER

CROSS-REFERENCE TO RELATED APPLICATION

The present application claims priority under 35 U.S.C. § 119(a) to Korean Patent Application No. 10-2017-0046137 filed on Apr. 10, 2017, the disclosure of which is incorporated herein by reference in its entirety.

TECHNICAL FIELD

Various embodiments of the present invention relate to a controller and, more particularly, to a controller for use in a memory system and an operating method thereof.

DISCUSSION OF THE RELATED ART

The computer environment paradigm has changed to ubiquitous computing systems that can be used anytime and anywhere. That is, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces and solid state drives (SSD).

SUMMARY

Various embodiments are directed to a controller capable of processing quickly and reliably data of a memory device by minimizing the complexity and performance degradation of the memory system and maximizing the use efficiency of the memory device.

In accordance with an embodiment of the present invention, a controller may include: a first buffer suitable for buffering data read from a memory device; a second buffer suitable for buffering data to be written into the memory device; a processor suitable for, in response to a read command, control in the memory device to read data therefrom and the first buffer to buffer the read data; and a buffer management unit suitable for, in response to the read command, providing the buffered data of the first buffer when the second buffer does not currently buffer data to be read.

The buffer management unit may further provide the buffered data of the second buffer when the second buffer currently buffers the data to be read.

The buffer management unit may further determine whether or not the second buffer currently buffers the data to be read by comparing an address information provided along with the read command with an address information of the buffered data of the second buffer.

The processor may provide the buffer management unit with the address information provided along with the read command, and the buffer management unit may manage the address information of the buffered data of the first and second buffers.

The buffer management unit may determine whether or not the second buffer currently buffers the data to be read before the first buffer buffers the read data.

The buffer management unit may determine whether or not the second buffer currently buffers the data to be read after the first buffer buffers the read data.

In accordance with an embodiment of the present invention, an operating method of a controller including a first buffer suitable for buffering data read from a memory device and a second buffer suitable for buffering data to be written into the memory device, the operating method may include: controlling, by a processor of the controller, in response to a read command, the memory device to read data, therefrom and the first buffer to buffer the read data; and providing, by a buffer management unit of the controller, in response to the read command, the buffered data of the first buffer when the second buffer does not currently buffer data to be read.

The providing may further include by the buffer management unit, in response to the read command, the buffered data of the second buffer when the second buffer currently buffers the data to be read.

The determining may further include by the buffer management unit, whether or not the second buffer currently buffers the data to be read by comparing an address information provided along with the read command with an address information of the buffered data of the second buffer.

The providing, by the processor, may further include the buffer management unit with the address information provided along with the read command; and, the managing, by the buffer management unit, may further include the address information of the buffered data of the first and second buffers.

The determining may be performed before the controlling.

The determining may be performed after the controlling.

In accordance with an embodiment of the present invention, a memory system may include a controller operatively coupled to at least one memory device, the controller being suitable for: receiving a read and a write request from a host; buffering write data corresponding to the write request into a write buffer before storing the write data into the at least one memory device; reading data requested from thee host based on the read command from the at least one memory device and buffering the read requested data into a read buffer; determining whether the requested data are being buffered into the write buffer; transferring to the host the read requested data which are buffered in the read buffer when the requested data are not being buffered into the write buffer; and transferring to the host the read requested data which are being buffered in the write buffer when the requested data are being buffered into the write buffer.

The read and write buffers may be regions of a memory of the controller.

The controller may include a buffer management unit suitable for determining whether the requested data are being buffered into the write buffer.

The controller may include a processor suitable for: performing the receiving of the read and the write requests from the host; buffering the write data corresponding to the write request into the write buffer before storing the write data into the at least one memory device; reading data requested from the host based on the read command from the at least one memory device and buffering the read requested data into the read buffer; determining whether the requested data are being buffered into the write buffer; transferring to the host the read requested data which are buffered in the read buffer when the requested data are not being buffered into the write buffer; and transferring to the host the read requested data which are being buffered in the write buffer when the requested data are being buffered into the write buffer.

In accordance with various embodiments of the present invention, a controller and operating method thereof may process quickly and reliably data of a memory device by minimizing the complexity and performance degradation of the memory system and maximizing the use efficiency of the memory device.

DETAILED DESCRIPTION

Figure 1:
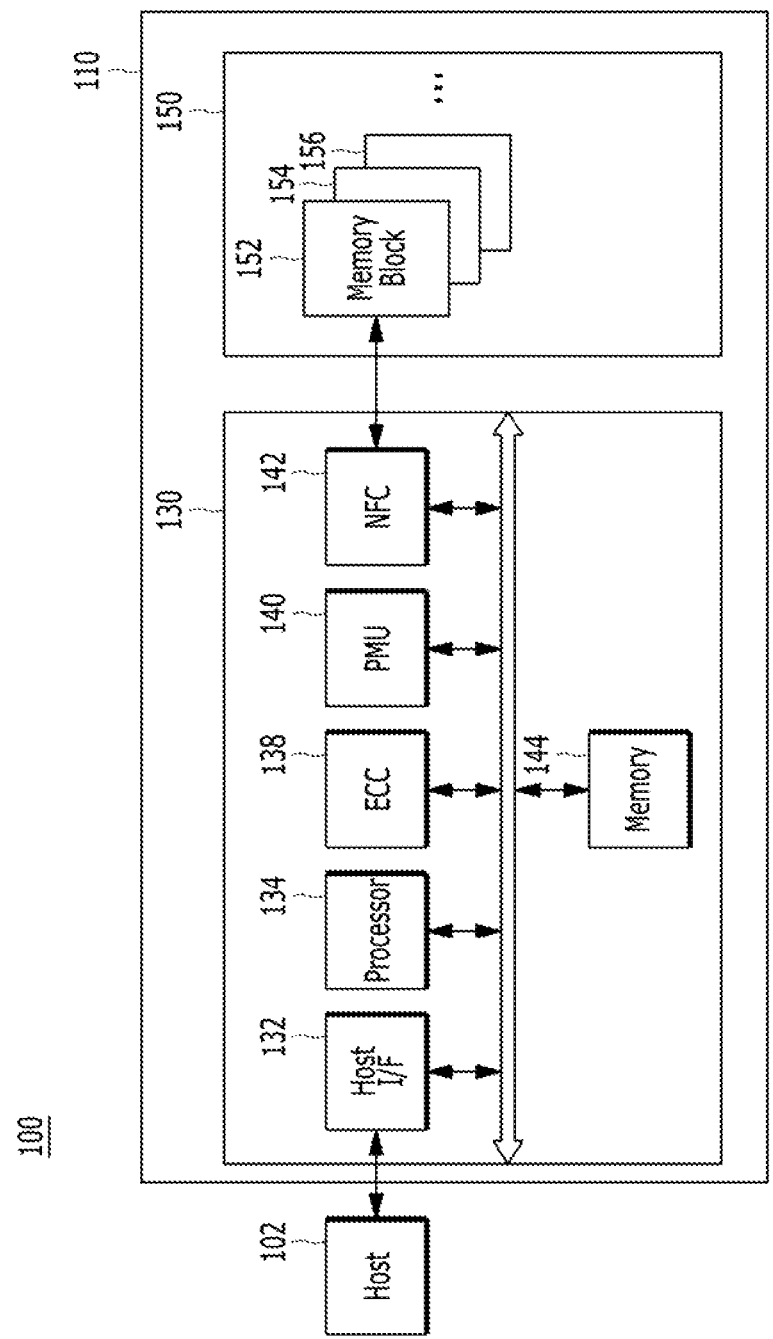
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include portable electronic devices such as a mobile phone, MP3 player and laptop computer or non-portable electronic devices such as a desktop computer, a game player, a TV, a projector and the like.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through, a read operation. The memory device 150 may include a plurality of memory dies (not shown), each memory die including a plurality of planes (not shown) each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. The controller 130 may control read, write, program and erase operations of the memory device 150.

The controller 130 may include a host interface (I/F) unit 132, a processor 134, an error correction code (ECC) unit 138, a power management unit (PMU) 140, a NAND flash controller (NFC) 142 and a memory 144 all operatively coupled via, an internal bus.

The host interface unit 132 may be configured to process a command and data of the host 102, and may communicate with the host 102 through one or more of various interface protocols such as) universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of detecting a bad block, in which a program fail occurs among the plurality of memory blocks 152 to 156 during a program operation due to the characteristic of a NAND flash memory. The management unit may also write the program-failed data of the bad block into a new memory block. In the memory device 150 having a 3D stack structure, the bad block management operation may increase the use efficiency of the memory device 150 and the reliability of the memory system 110.

Figure 2:
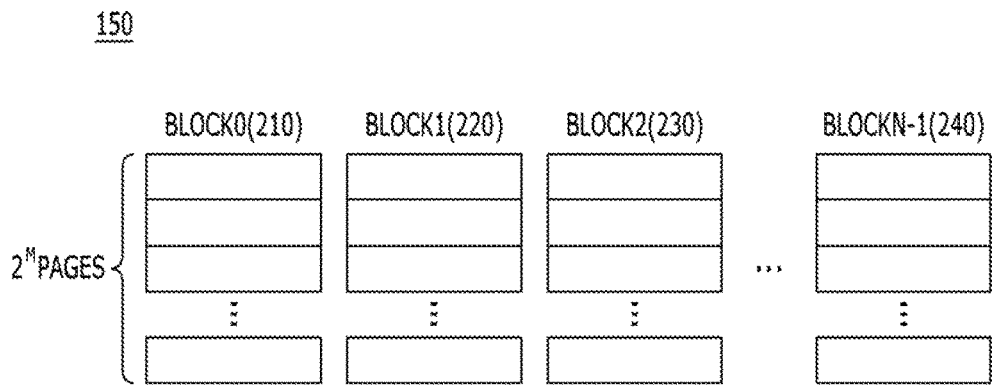
FIG. 2 is a schematic diagram illustrating a memory device shown in FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. Memory cells included in the respective memory blocks BLOCK 0 to BLOCKN−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
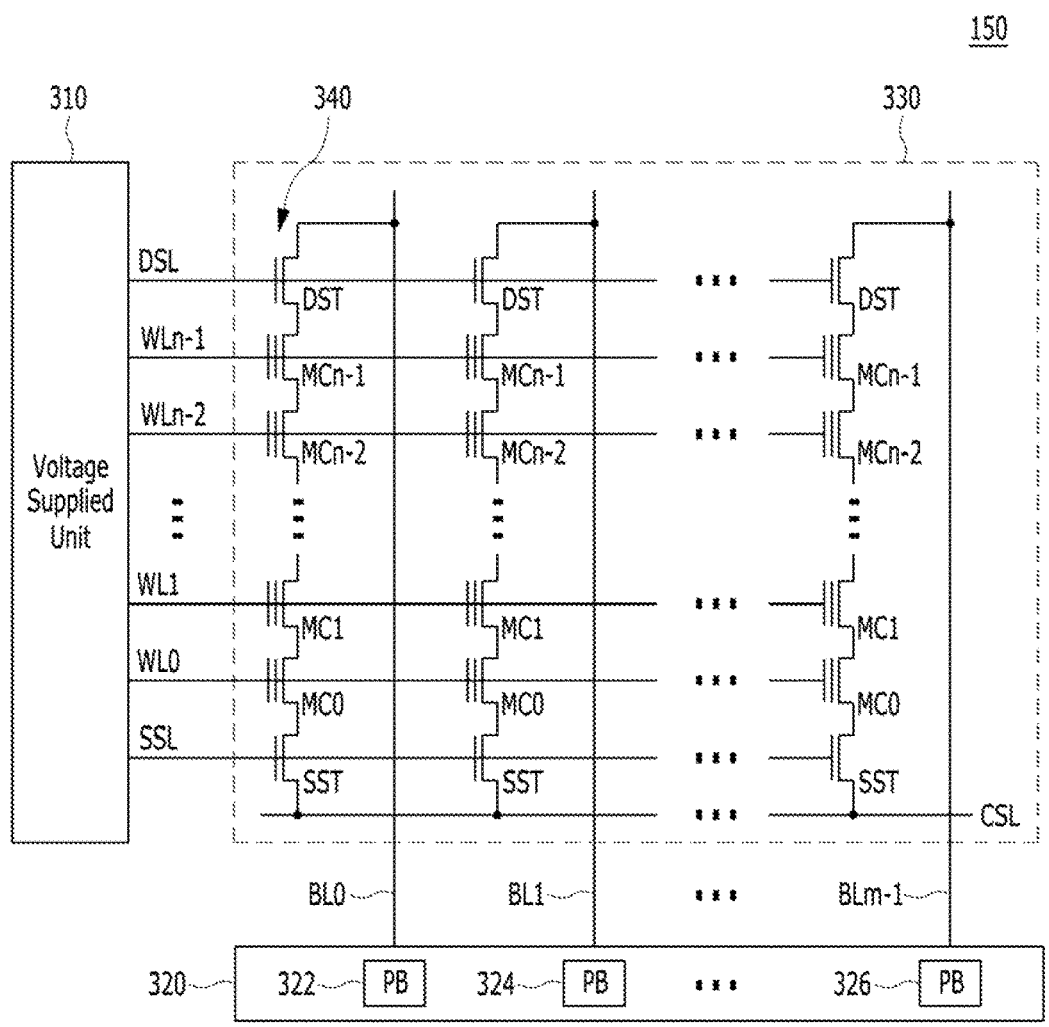
FIG. 3 is a circuit diagram illustrating a memory block in a memory device shown in FIG. 1.

FIG. 3 is a circuit diagram illustrating a memory block 330 in the memory device 150.

Referring to FIG. 3, the memory block 330 which corresponds to any of the plurality of memory blocks 152 to 156.

Referring to FIG. 3, the memory block 152 of the memory device 150 may include a plurality of cell strings 340 electrically coupled to bit lines BL0 to BLm−1, respectively. The cell string 340 of each column may include one or more drain select transistors DST and one or more source select transistors SST. Between drain and the select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding one among the bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
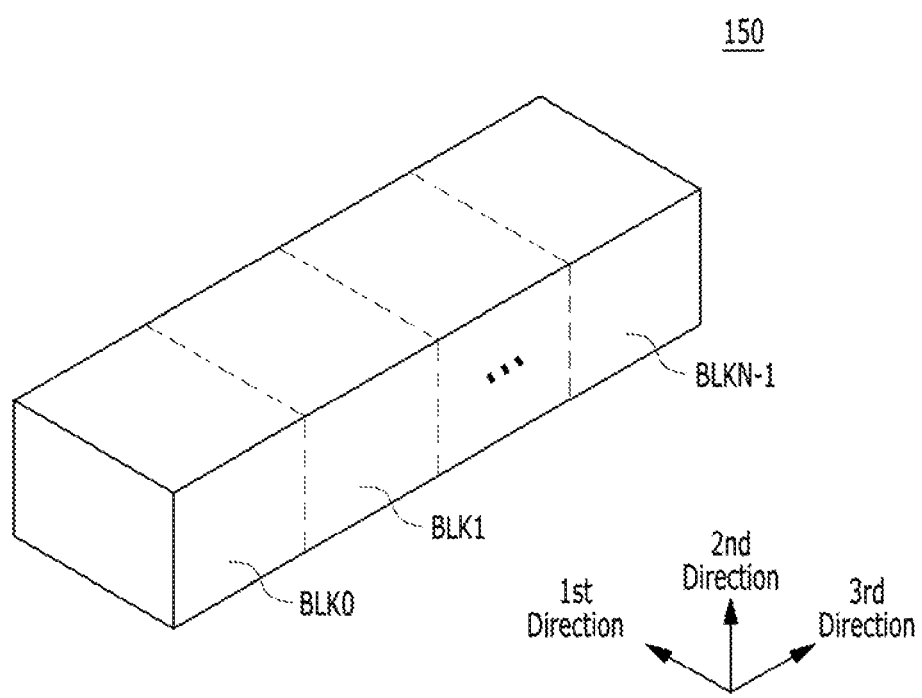
FIG. 4 is a schematic diagram illustrating a 3D structure of the memory device shown in FIG. 1.

FIG. 4 is a schematic diagram illustrating a 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
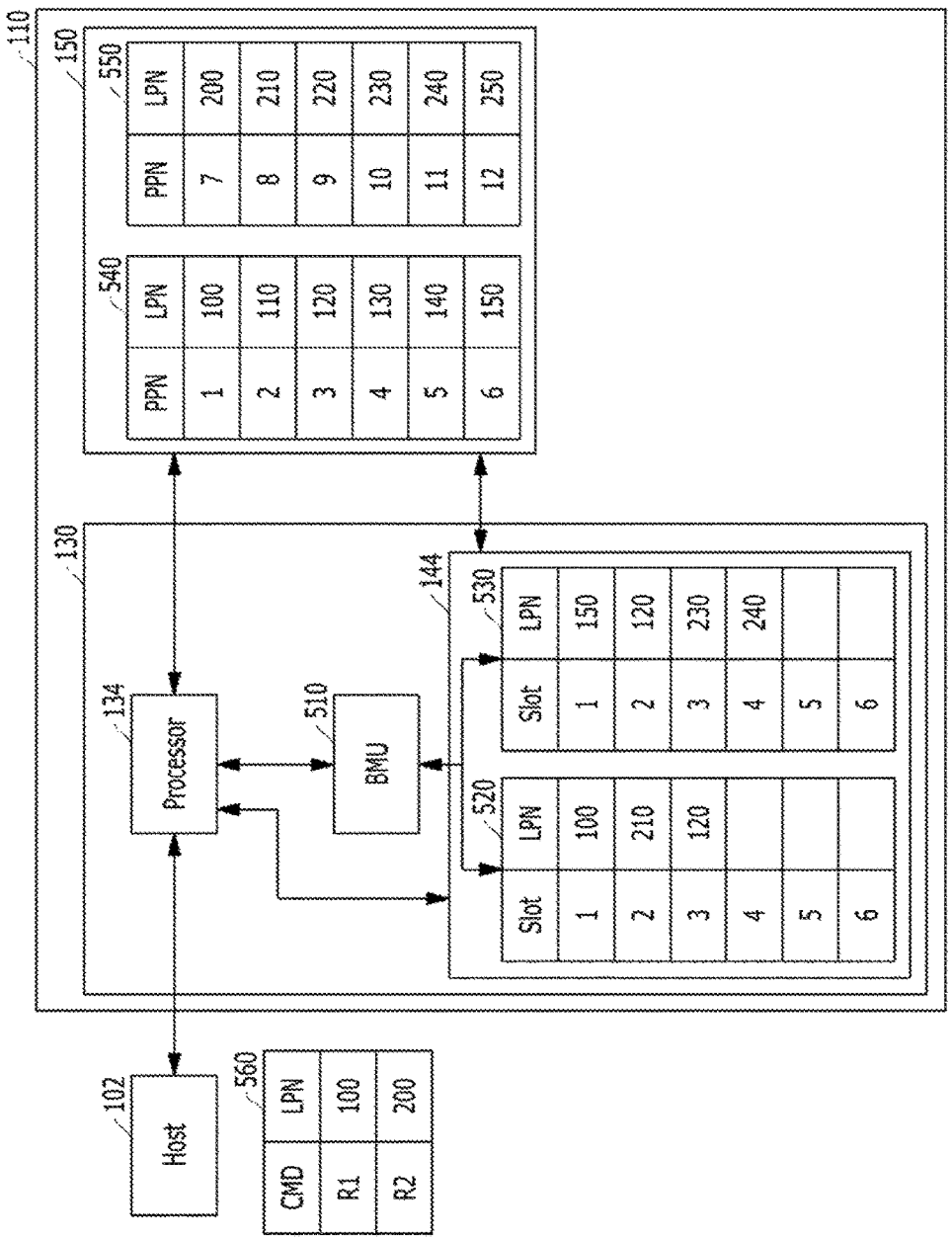
FIG. 5 is a block diagram illustrating an operation of the memory system in accordance with an embodiment of the present inventions.
Figure 6:
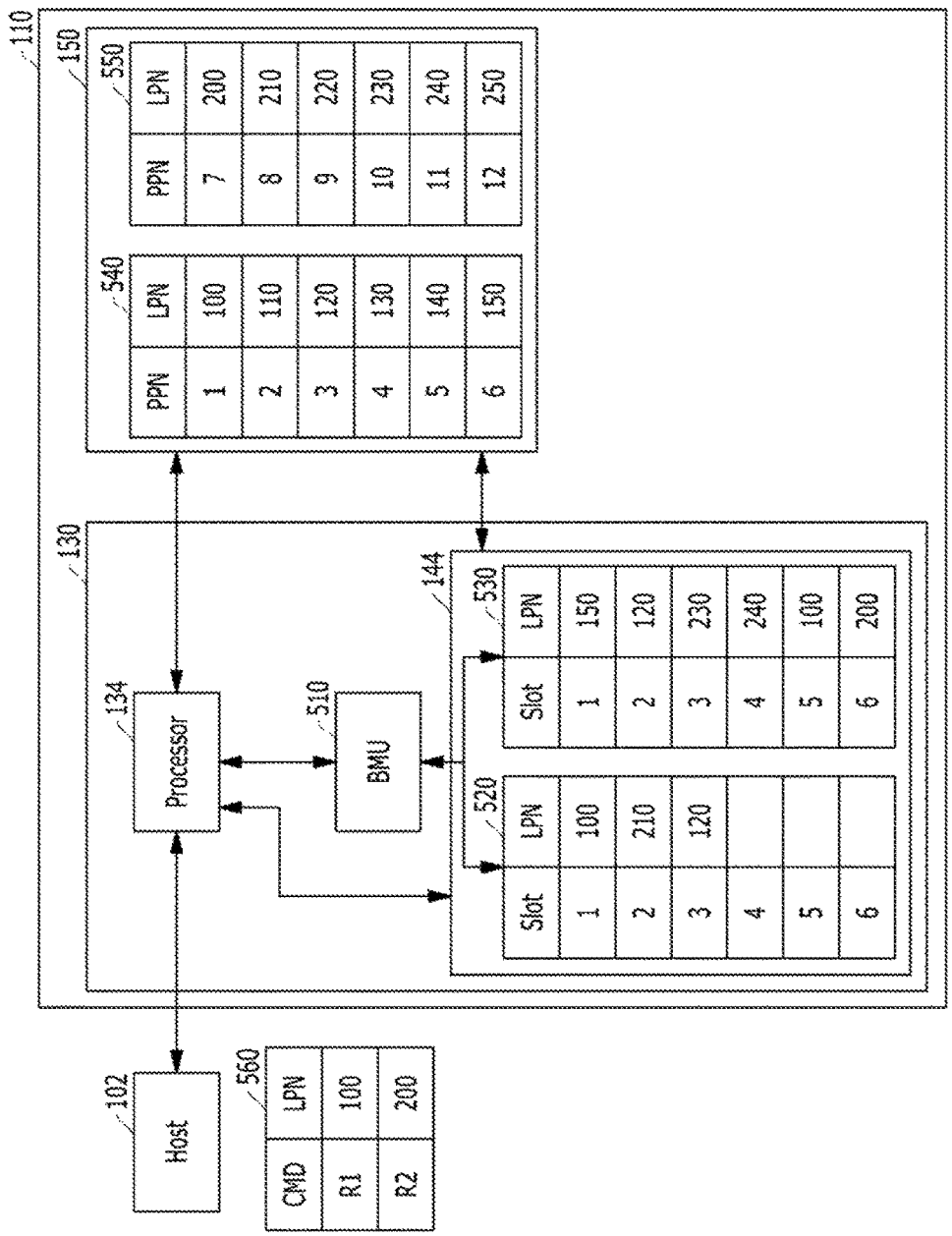
FIG. 6 is a block diagram illustrating an operation of the memory system in accordance with an embodiment of the present invention.

FIGS. 5 and 6 are block diagrams illustrating an operation of the memory system in accordance with an embodiment of the present invention.

The host 102 may provide a command to the memory system 110. The commands may be write and read commands and so forth. In response to a write command, the memory system 110 may program data into a region of a particular address. In response to a read command, the memory system 110 may read data programmed into a region of a particular address, and provide the read data to the host 102. The command may be provided along with the particular address. An address may include a logical address such as a logical page number (LPN) and a physical address such as a physical page number (PPN). For example, a write command may be provided along with an address indicating a region, into which data is written, and a read command may be provided along with an address indicating a region, from which data is read.

The controller 130 may further include a buffer management unit 510. The memory 144 may include a write buffer 520 buffering data to be written into the memory device 150, and a read buffer 530 buffering data read from the memory device 150. The memory device 150 may include a plurality of memory blocks 540 and 550.

FIG. 5 exemplifies the write buffer 520 buffering data of logical addresses or logical page numbers of values 100, 210 and 120 (i.e., LPN 100, LPN 210 and LPN 120) in first to third slots of the write buffer 520. Also, FIG. 5 exemplifies the read buffer 530 buffering data of logical addresses or logical page numbers of values 150, 120, 230 and 240 (i.e., LPN 150, LPN 120, LPN 230 and LPN 240) in first to fourth slots of the read buffer 530.

Further, FIG. 5 exemplifies a first memory block 540 storing data at regions of physical addresses or physical page numbers of values 1 to 6 (i.e., PPN 1 to PPN 6) corresponding to logical addresses or logical page numbers of values 100 to 150 (i.e., LPN 100 to LPN 150), and a second memory block 550 storing data at regions of physical addresses or physical page numbers of values 7 to 12 (i.e., PPN 7 to PPN 12) corresponding to logical addresses or logical page numbers of values 200 to 250 (i.e., LPN 200 to LPN 250).

Still further, FIG. 5 exemplifies first and second read commands R1 and R2 sequentially provided from the host 102 to the memory system 110. As illustrated in a list 560 of FIG. 5, the first read command R1 may indicate a read operation to data from a region of a logical page number of value 100 (i.e., LPN 100) in the memory device 150, and the second read command R2 may indicate a read operation to data from a region of a logical page number of value 200 (i.e., LPN 200) in the memory device 150.

For example, when the host 102 provides a write command to the memory system 110, the memory system 110 may buffer data corresponding to the write command which are also provided from the host 102 into the write buffer 520 and then may write the buffered data into the memory blocks 540 and 550 of the memory device 150. After completion of the writing of the buffered data into the memory blocks 540 and 550, the memory system 110 may update a map data. The map data may represent mapping relation between a logical address and a physical address of the memory device 150. The map data may include logical-to-physical (L2P) map data and physical-to-logical (P2L) map data. The map data may be stored in one or more of the memory 144 and the memory device 150.

For example, when the host 102 provides a read command to the memory system 110, the memory system 110 may firstly determine whether or not data to be read is currently being buffered in the write buffer 520. When the data to be read is currently being buffered in the write buffer 520, the memory system 110 may provide the buffered data of the write buffer 520 to the host 102. When the data to be read is not currently being buffered in the write buffer 520, the memory system 110 may control the memory device 150 to read data and provide the read data to the host 102.

As exemplified in FIG. 5, in response to the first read command R1 for data of the logical page number of value 100 (LPN 100), the memory system 110 may read the data of the logical page number of value 100 (LPN 100) from the write buffer 520 and may provide the read data to the host 102 since the data of the logical page number of value 100 (LPN 100) is currently being buffered in the first slot of the write buffer 520.

However, as exemplified in FIG. 5, in response to the second read command R2 for data of the logical page number of value 200 (LPN 200), the memory system 110 may control the memory device 150 to read the data of the logical page number of value 200 (LPN 200) from a region of the physical page number of value 7 (PPN 7) in the second memory block 550 according to the map data, may buffer the read data into the read buffer 530, and may provide the buffered data to the host 102 since the logical page number of value 200 (LPN 200) is not currently being buffered in the write buffer 520 when the second read command R2 is provided and the map data indicates that the physical page number of value 7 (PPN 7) corresponds to the logical page number of value 200 (LPN 200).

Therefore, when the write buffer 520 does not currently buffer data related to a read command, it takes time to control the memory device 150 to perform a read operation due to a time taken to determine whether or not data to be read is currently being buffered in the write buffer 520, which causes increased latency of a read operation.

In order to solve the problem in accordance with an embodiment of the present invention, the memory system 110 may include the buffer management unit 510. Hereinafter, described with reference to FIGS. 5 and 6 will be an operation of the memory system 110 processing a read command using the buffer management unit 510 in accordance with an embodiment of the present invention.

In response to a read command from the host 102, the processor 134 of the memory system 110 may control the memory device 150 to read data. For example, in response to the first and second read commands R1 and R2, which respectively correspond to logical page numbers of values 100 and 200 (i.e., LPN 100 and LPN 200), the memory system 110 may control the memory device 150 to read data of the logical page number of value 100 (i.e., LPN 100) and then may control the memory device 150 to read data of the logical page number of value 200 (i.e., LPN 200).

When controlling the memory device 150 to read data, the processor 134 may provide the memory device 150 with a physical page number PPN corresponding to the provided logical page number LPN by consulting the L2P map data. For example, the processor 134 may provide the memory device 150 with the physical page number of value 1 (PPN 1), which corresponds to the logical page number of value 100 (LPN 100) in the L2P map data, in response to the first read command R1 of the logical page number of value 100 (LPN 100), and then may provide the memory device 150 with the physical page number of value 7 (PPN 7), which corresponds to the logical page number of value 200 (LPN 200) in the L2P map data, in response to the second read command R2 of the logical page number of value 200 (LPN 200).

Further, the processor 134 may provide the buffer management unit 510 with the logical page number LPN provided along with the read command from the host 102. For example, the processor 134 may provide the buffer management unit 510 with the logical page number of value 100 (LPN 100) for the first read command R1 and then may provide the buffer management unit 510 with the logical page number of value 200 (LPN 200) for the second read command R2.

Under the control of the processor 134, the memory device 150 may read data from regions of the provided physical page numbers in the memory blocks 540 and 550, and may provide the read data to the read buffer 530. For example, the memory device 150 may read data from a region of the physical page number of value 1 (PPN 1) which corresponds to the logical page number of value 100 (LPN 100), and may provide the read data to the read buffer 530, for the first read command R1. For example, the memory device 150 may read data from a region of the physical page number of value 7 (PPN 7), which corresponds to the logical page number of value 200 (LPN 200), and may provide the read data to the read buffer 530, for the second read command R2.

The read buffer 530 may buffer data provided from the memory device 150. As exemplified in FIG. 6, the read buffer 530 may buffer data of the logical page number of value 100 (LPN 100) and the logical page number of value 200 (LPN 200) in fifth and sixth slots, respectively.

The buffer management unit 510 may determine whether or not the write buffer 520 currently buffers data to be read in response to the read command from the host 102 by comparing values of logical page numbers of data currently being buffered in slots of the write buffer 520 and values of logical page numbers provided along with read commands from the processor 134.

When the write buffer 520 is determined to currently buffer data to be read in response to the read command, the buffer management unit 510 may provide the buffered data to the processor 134. When the write buffer 520 is determined not to currently buffer data to be read in response to, the read command, the buffer management unit 510 may provide data buffered in the read buffer 530 to the processor 134.

As exemplified in FIG. 6, the buffer management unit 510 may provide the processor 134 with data buffered in the first slot of the write buffer 520 in response to the first read command R1 since the write buffer 520 is currently buffering in the first slot data of the logical page number of value 100 (LPN 100) to be read for the first read command R1.

However, as exemplified in FIG. 6, the buffer management unit 510 may provide the processor 134 with data buffered in the sixth slot of the read buffer 530 in response to the second read command R2 since the write buffer 520 is not currently buffering data of the logical page number of value 200 (LPN 200) to be read for the second read command R2 while the read buffer 530 is currently buffering in the sixth slot data of the logical page number of value 200 (LPN 200).

As described above, in response to a read command, the processor 134 may promptly control the memory device 150 to read data such that the memory device 150 may perform a read operation as soon as the read command is provided to the memory system 110. Therefore, even when the memory 144 is not currently buffering data for the read command, the memory system 110 may promptly respond to the read command.

Although FIGS. 5 and 6 exemplify that the buffer management unit 510 determines whether or not the write buffer 520 is currently buffering data after reading data from the memory device 150 and buffering the read data into the read buffer 530, this is mere example. The buffer management unit 510 may determine whether or not the write buffer 520 is currently buffering data before reading data from the memory device 150 and buffering the read data into the read buffer 530. Accordingly, the memory system 110 may promptly respond to a read command by determining whether or not the write buffer 520 is currently buffering data before completion of a read operation of reading data from the memory device 150 and a buffer operation of buffering the read data into the read buffer 530.

Figure 7:
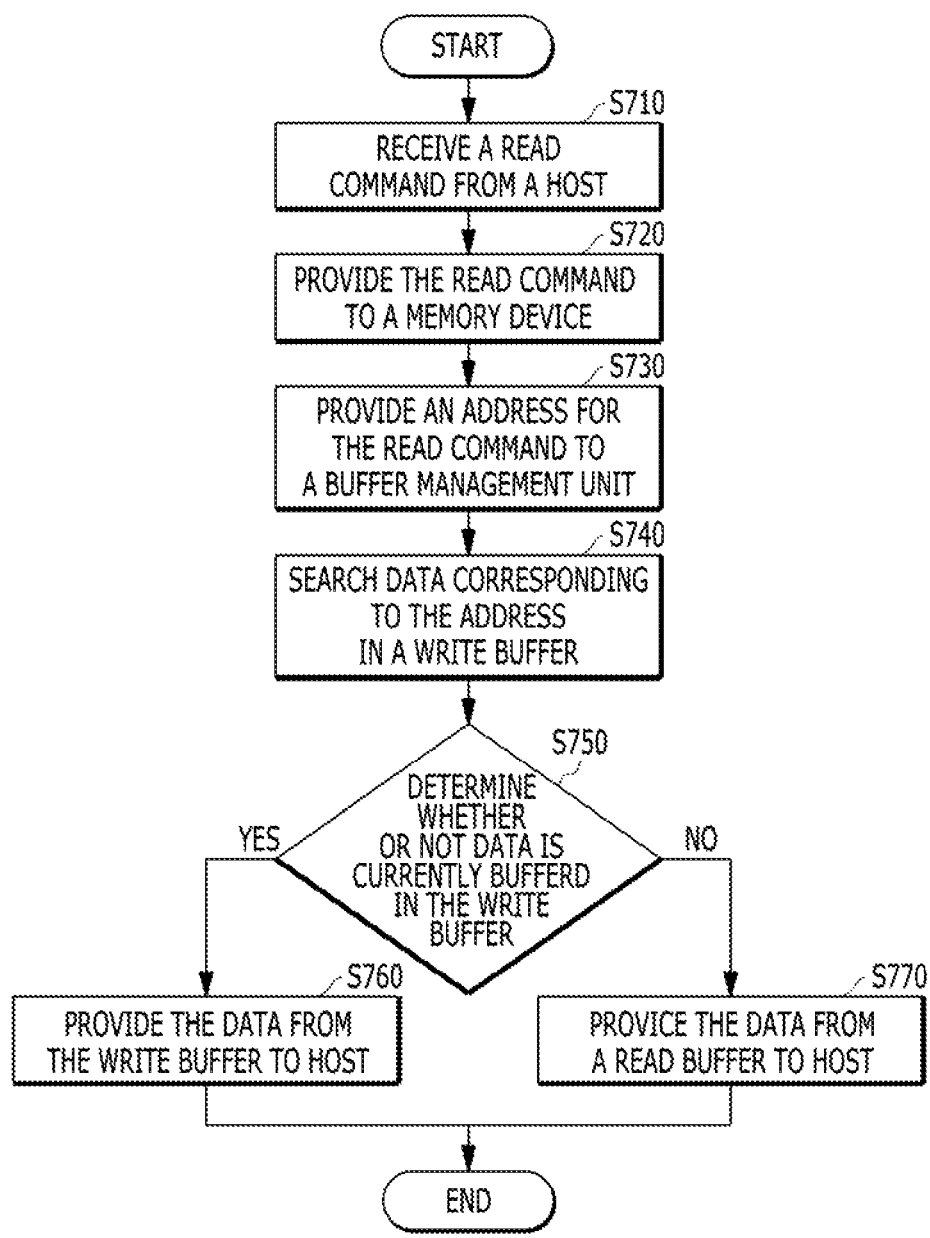
FIG. 7 is a flow chart illustrating an operation of the memory system in accordance with an embodiment of the present invention.

FIG. 7 is a flow chart illustrating an operation of the memory system 100 in accordance with an embodiment of the present invention.

Referring to FIG. 7, at step S710, the processor 134 of the controller 130 may receive a read command from the host 102.

At step S720, the processor 134 may control the memory device 150 to read data in response to the provided read command.

At step S730, the processor 134 may provide the buffer management unit 510 with a logical address provided from the host 102 along with the read command.

At step S740, the buffer management unit 510 may search the write buffer 520 in order to determine whether or not data of the provided logical address is currently being buffered in the write buffer 520 by comparing values of logical addresses of data currently being buffered in slots of the write buffer 520 and a value of the provided logical address.

At step S750, the buffer management unit 510 may determine whether or not data of the provided logical address is currently being buffered in the write buffer 520. The process may proceed to step S760 when data of the provided logical address is determined to be currently buffered in the write buffer 520 ("YES" at step S750), and may proceed to step S770 when data of the provided logical address is determined not to be currently buffered in the write buffer 520 ("NO" at step S750).

At step S760, the buffer management unit 510 may provide the currently buffered data of the write buffer 520 to the processor 134 and the processor 134 may transfer the provided data to the host 102. That is, the buffer management unit 510 may provide the currently buffered data of the write buffer 520 to the host 102 when data of the logical address provided from the host 102 is determined to be currently buffered in the write buffer 520.

At step S770 the buffer management unit 510 may provide the data, which corresponds to the logical address provided from the host 102 and is read from the memory device 150 and then currently buffered into the read buffer 530, from the read buffer 530 to the processor 134 and the processor 134 may transfer the provided data to the host 102. That is, the buffer management unit 510 may provide the data, which corresponds to the logical address provided from the host 102 and is read from the memory device 150 and then currently buffered into the read buffer 530, from the read buffer 530 to the host 102 when data of the logical address provided from the host 102 is determined not to be currently buffered in the write buffer 520.

FIGS. 8 to 13 are schematic diagrams illustrating application examples of the data processing system of FIGS. 1 to 7.

Figure 8:
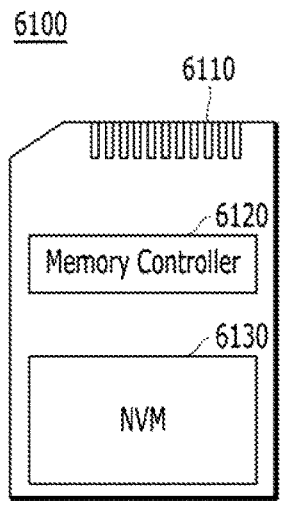
FIGS. 8 to 13 are schematic diagrams illustrating application examples of the data processing system shown in FIGS. 1 to 7.

In the embodiments of FIGS. 8 to 13 it should be understood that the memory controllers 6120, 6220, 6320, 6430 may in addition to the elements shown in the respective FIGS, may also include the elements of FIGS. 1, 5 and 6 and may perform the operations described in relation to FIGS. 1 to 7. FIG. 8 is a diagram schematically illustrating another example of the data processing system including the memory system in accordance with an embodiment. Specifically, FIG. 8 schematically illustrates a memory card system including a memory system, in accordance with an embodiment.

Referring to FIG. 8, the memory card system 6100 may include a memory controller 6120, a memory device 6130 and a connector 6110.

The memory controller 6120 may be connected to the memory device 6130 embodied by a nonvolatile memory, and may access the memory device 6130. For example, the memory controller 6120 may control read, write, erase and background operations of the memory device 6130. The memory controller 6120 may provide an interface between the memory device 6130 and a host, and drive firmware for controlling the memory device 6130. That is, the memory controller 6120 may correspond to the controller 130 of the memory system 110, and the memory device 6130 may correspond to the memory device 150 of the memory system 110.

Therefore, the memory controller 6120 may include components such as a RAM, a processing unit, a host interface, a memory interface and an error correction unit as illustrated in FIG. 1. The memory controller 130 may further include the elements shown in FIG. 1 and perform the operations described in reference to FIGS. 1 to 7.

The memory controller 6120 may communicate with an external device, for example, the host 102, through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Accordingly, the memory system and the data processing system may be applied to wired/wireless electronic appliances, in particular, a mobile electronic appliance.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150.

The memory controller 6120 and the memory device 6130 may be integrated into a single semiconductor device. For example, the memory controller 6120 and the memory device 6130 may construct a solid-state driver (SSD) by being integrated into a single semiconductor device. Also the memory controller 6120 and the memory device 6130 may construct a memory card such as a PC card (PCMCIA: Personal Computer Memory Card International Association) a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 9:
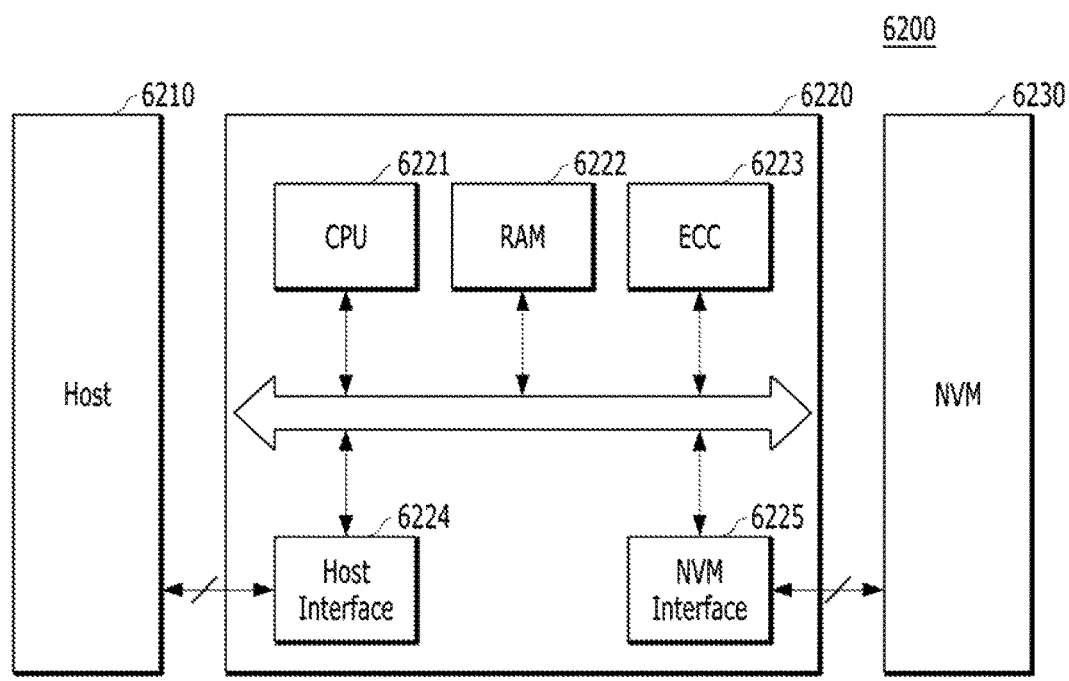

FIG. 9 is a diagram schematically illustrating another example of a data processing system 6200 including the memory system according to an embodiment of the present invention.

Referring to FIG. 9, the data processing system 6200 may include a memory device 6230 which may be implemented by at least one nonvolatile memory (NVM) and a memory controller 6220 which controls the memory device 6230. The data processing system 6200 illustrated in FIG. 9 may serve as a storage medium such as a memory card (CF, SD, micro-SD or the like) or USB device, as described with reference to FIG. 1. The memory device 6230 may correspond to the memory device 150 in the memory system 110, and the memory controller 6220 may correspond to the controller 130 in the memory system 110.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230 thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 10:
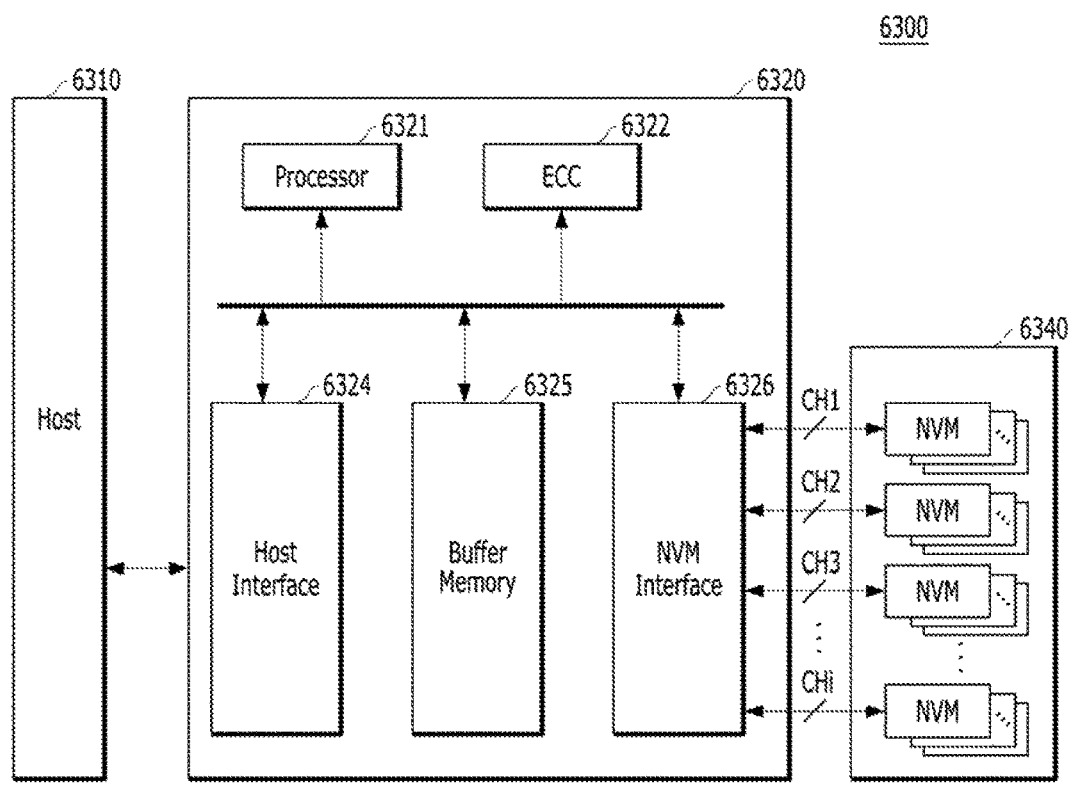

FIG. 10 is a diagram schematically illustrating another example of the data processing system including the memory system in accordance with an embodiment. Specifically, FIG. 10 schematically illustrates an SSD.

Referring to FIG. 10, the SSD 6300 may include a controller 6320 and a memory device 6340 including a plurality of nonvolatile memories. The controller 6320 may correspond to the controller 130, and the memory device 6340 may correspond to the memory device 150.

The controller 6320 may be connected to the memory device 6340 through a plurality of channels CH1 to CHi. The controller 6320 may include at least one processor 6321, a buffer memory 6325, an ECC circuit 6322, a host interface 6324, and a memory interface such as a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
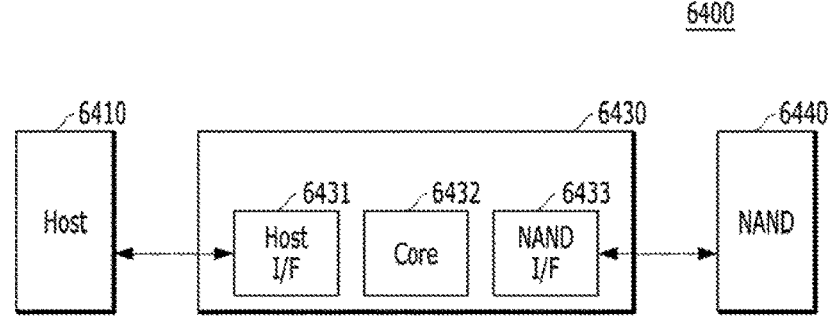

FIG. 11 is a diagram schematically illustrating another example of the data processing system including the memory system in accordance with an embodiment. Specifically, FIG. 11 schematically illustrates an embedded Multi-Media Card (eMMC).

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

The controller 6430 may be connected with the memory device 6440 through a plurality of channels. The controller 6430 may include a host interface 6431, at least one core 6432 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed-I/II interface.

Figure 12:
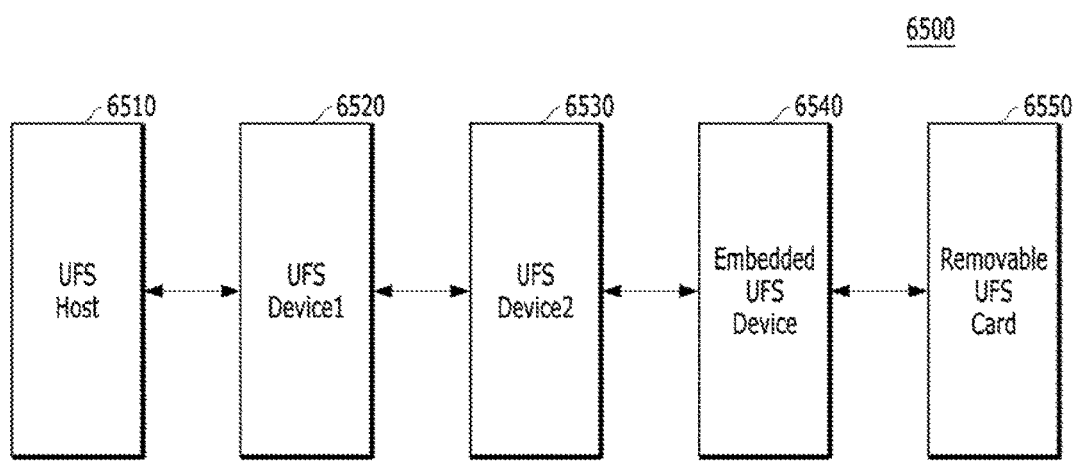

FIG. 12 is a diagram schematically illustrating another example of the data processing system including the memory system, in accordance with an embodiment. Specifically, FIG. 12 schematically illustrates a universal flash storage (UFS) system 6500.

Referring to FIG. 12, the UFS system 6500 may include a UFS host 6510, a plurality of UFS devices 6520 and 6530, an embedded UFS device 6540, and a removable UFS card 6550. The UFS host 6510 may be an application processor wired/wireless electronic appliances, in particular, a mobile electronic appliance.

The UFS host 6510, the UFS devices 6520 and 6530, the embedded UFS device 6540 and the removable UFS card 6550 may respectively communicate with external devices, that is, wired/wireless electronic appliances, in particular, a mobile electronic appliance, through a UFS protocol. The UFS devices 6520 and 6530, the embedded UFS device 6540 and the removable UFS card 6550 may be implemented as the memory system 110 described above with reference to FIGS. 1 to 7, in particular, as the memory card system 6100 described above with reference to FIG. 8. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), a multimedia card (MMC), secure digital (SD), mini SD and Micro SD.

Figure 13:
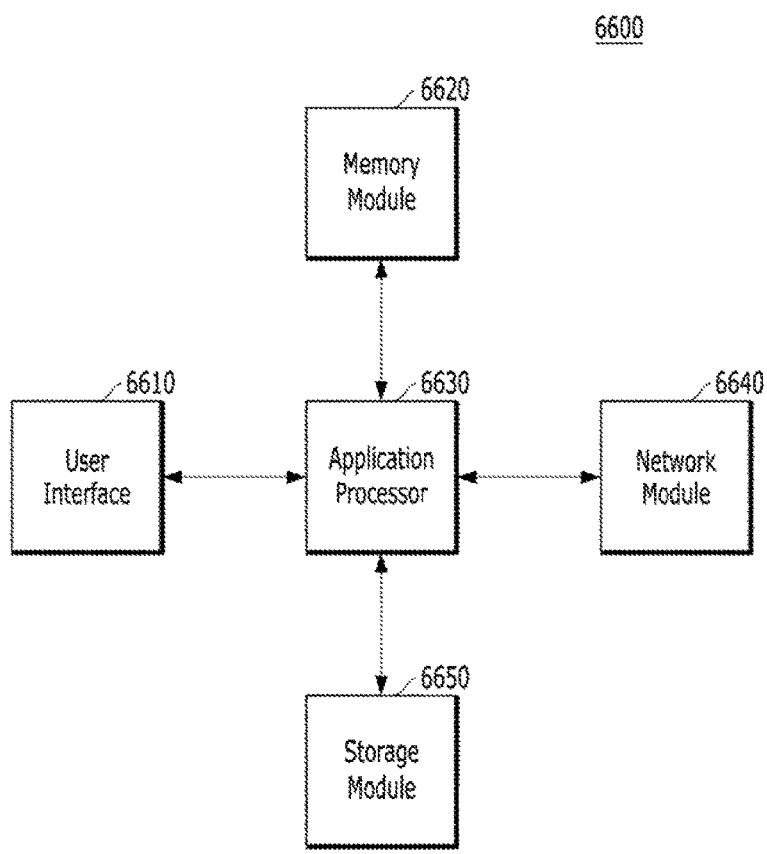

FIG. 13 is a diagram schematically illustrating another example of the data processing system including the memory system in accordance with an embodiment. Specifically, FIG. 13 schematically illustrates a user system 6600.

Referring to FIG. 13, the user system 6600 may include a user interface 6610, a memory module 6620, an application processor 6630, a network module 6640 and a storage module 6650.

The application processor 6630 may drive components included in the user system 6600, for example, an operating system (OS), and include controllers, interfaces and a graphic engine which control the components included in the user system 6600. The application processor 6630 may be provided as System-on-Chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA) global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic devices or particularly mobile electronic devices. Therefore, the memory system and the data processing system can be applied to wired/wireless electronic devices. The network module 6640 may be included in the application processor 6630.

The storage module 6650 may store data, for example, data provided from the application processor 6630, and then transmit the stored data to the application processor 6630. The storage module 6650 may be embodied by nonvolatile semiconductor memory devices such as a phase-change RAM (PRAM), a magnetic RAM (MRAM), a resistive RAM (ReRAM), a NAND flash memory, NOR flash memory and 3D NAND flash memory, and provided as a removable storage medium such as a memory card or external drive of the user system 6600. That is, the storage module 6650 may correspond to the memory system 110 described with reference to FIGS. 1 to 7. Furthermore, the storage module 6650 may be embodied by SSD, eMMC and UFS described with reference to FIGS. 10 to 12.

The user interface 6610 may include interfaces for inputting data or commands to the application processor 6630 or outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), a light emitting diode (LED), an organic LED (OLED) display device, an active matrix OLEO (AMOLED) display device, a speaker and a motor.

Furthermore, when the memory system 110 is applied to a mobile electronic device of the user system 6600, the application processor 6630 may control overall operations of the mobile electronic device, and the network module 6640 may serve as a communication module for controlling wired/wireless communication with an external device. The user interface 6610 may display data processed by the application processor 6630 on a display/touch module of the mobile electronic device, or support a function of receiving data from the touch panel.

In a memory system and an operating method for the memory system in accordance with embodiments, data may be programmed to a plurality of regions of a memory device, and, when an error occurs in data of any one of the regions, data of the other regions may substitute for the data in which the error occurs. Therefore, data may be protected from an error by managing only information (addresses) corresponding to the data without performing a substantial operation of correcting the error or copying the data.

Furthermore, the operation of the present disclosure may also be applied to an operation such as a garbage collection operation in such a way that valid data of a victim region may be replaced with data that has been stored together therewith. Therefore, an operation of copying, that is, reading and programming data, may be omitted when valid data are collected, thereby reducing overhead of a memory system in operation of securing free space of a memory device.

Although various embodiments have been described for illustrative purposes, it will be apparent to those skilled in the art that various other embodiments, and changes or modifications thereof may be made without departing from the spirit and scope of the invention as defined in the following claims.

What is claimed is:

1. A controller comprising:
   a first buffer configured to buffer data read from a memory device;
   a second buffer configured to buffer data to be written into the memory device;
   a processor configured to, in response to a read command, read target data corresponding to the read command from the memory device and store the target data into the first buffer; and
   a buffer management unit configured to determine whether or not the second buffer currently buffers the target data after the target data is stored into the first buffer and provide the target data stored in the first buffer to the processor when the second buffer does not currently buffer the target data.

2. The controller of claim 1, wherein the buffer management unit further provides the target data flail stored in the second buffer to the processor when the second buffer currently buffers the target data.

3. The controller of claim 1, wherein the buffer management unit further determines whether or not the second buffer currently buffers the target data by comparing an address information provided along with the read command with an address information of the target data stored in the second buffer.

4. The controller of claim 3,
   wherein the processor provides the buffer management unit with the address information provided along with the read command, and
   wherein the buffer management unit manages the address information of the target data.

5. The controller of claim 3, wherein the buffer management unit determines whether or not the second buffer currently buffers the target data before the first buffer buffers the target data read from the memory device.

6. The controller of claim 3, wherein the buffer management unit determines whether or not the second buffer currently buffers the target data after the first buffer buffers the target data read from the memory device.

7. An operating method of a controller including a first buffer configured to buffer data read from a memory device and a second buffer configured to buffer data to be written into the memory device, the operating method comprising:
   reading, by a processor of the controller, in response to a read command, target data corresponding to the read command from the memory device;
   storing, by the processor, the target data into the first buffer;
   after the target data is stored into the first buffer, determining, by a buffer management unit of the controller, whether or not the second buffer currently buffers the target data; and
   providing, by the buffer management unit, the target data stored in the first buffer to the processor when the second buffer does not currently buffer the target data.

8. The operating method of claim 7, further comprising, providing, by the buffer management unit, the target data stored in the second buffer when the second buffer currently buffers the target data.

9. The operating method of claim 7, further comprising determining, by the buffer management unit, whether or not the second buffer currently buffers the target data by comparing an address information provided along with the read command with an address information of the target data stored in the second buffer.

10. The operating method of claim 9, further comprising:
    providing, by the processor, the buffer management unit with the address information provided along with the read command; and
    managing, by the buffer management unit, the address information of the target data.

11. The operating method of claim 9, wherein the determining is performed before the first buffer buffers the target data read from the memory device.

12. The operating method of claim 9, wherein the determining is performed after the first buffer buffers the target data read from the memory device.

13. A memory system comprising a controller operatively coupled to at least one memory device,
    the controller configured to:
    receive a read request and a write request from a host;
    buffer write data corresponding to the write request into a write buffer before storing the write data into the at least one memory device;

read data requested from the host based on the read command from the at least one memory device and buffering the read requested data into a read buffer;

after the read requested data is buffered into the read buffer, determine whether the read requested data are being buffered into the write buffer;

transfer, to the host the read requested data which are buffered in the read buffer when the read requested data are not being buffered into the write buffer; and transfer, to the host the read requested data which are being buffered in the write buffer when the requested data are being buffered into the write buffer.

14. The memory system of claim 13, wherein the read and write buffers are regions of a memory of the controller.

15. The memory system of claim 13, wherein the controller comprises a buffer management unit configured to determine whether the requested data are being buffered into the write buffer.

16. The memory system of claim 13, wherein the controller comprises a processor configured to:

perform the receiving of the read and the write requests from the host;

buffer the write data corresponding to the write request into the write buffer before storing the write data into the at least one memory device;

read data requested from the host based on the read command from the at least one memory device and buffering the read requested data into the read buffer;

determine whether the requested data are being buffered into the write buffer;

transfer to the host the read requested data which are buffered in the read buffer when the requested data are not being buffered into the write buffer; and transfer to the host the read requested data which are being buffered in the write buffer when the requested data are being buffered into the write buffer.

* * * * *